(12) United States Patent
Chevallier

(10) Patent No.: US 8,575,761 B2
(45) Date of Patent: Nov. 5, 2013

(54) SEGMENTED SUPPLY RAIL CONFIGURATION FOR A DIGITAL INTEGRATED CIRCUIT

(75) Inventor: Remy Chevallier, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/370,374

(22) Filed: Feb. 10, 2012

(65) Prior Publication Data

US 2012/0217649 A1    Aug. 30, 2012

(30) Foreign Application Priority Data

Feb. 25, 2011  (FR) ...................................... 11 51526

(51) Int. Cl.
*H01L 23/522*    (2006.01)

(52) U.S. Cl.
USPC ............ 257/774; 257/E23.145; 257/E27.108; 257/E21.582; 257/700; 257/701; 257/773; 257/691; 257/758

(58) Field of Classification Search
USPC .......... 257/774, 700, 701, 773, E23.145, 758, 257/E27.108, E21.582, 691; 438/633
See application file for complete search history.

(56) References Cited

U.S. PATENT DOCUMENTS

| 6,202,191 B1 | 3/2001 | Filippi et al. |
| 2006/0071319 A1 | 4/2006 | Nishimura |
| 2010/0072459 A1* | 3/2010 | Bertin et al. .................... 257/24 |
| 2012/0081775 A1* | 4/2012 | Ersman et al. ................ 359/270 |

FOREIGN PATENT DOCUMENTS

| JP | 2001-243262 | * | 9/2001 |
| WO | WO-9710614 A1 | | 3/1997 |

OTHER PUBLICATIONS

French Search Report and Written Opinion for FR1151526 mailed Oct. 18, 2011 (6 pages).

* cited by examiner

*Primary Examiner* — A O Williams
(74) *Attorney, Agent, or Firm* — Gardere Wynne Sewell LLP

(57) ABSTRACT

An array of functional cells includes a subset of cells powered by at least one supply rail. That supply rail is formed of first segments located on a first metallization level and second segments located on a second metallization level with at least one conductor element extending between the first and second segments to electrically connect successive segments of the supply rail.

20 Claims, 2 Drawing Sheets

SEGMENTED SUPPLY RAIL CONFIGURATION FOR A DIGITAL INTEGRATED CIRCUIT

PRIORITY CLAIM

This application claims priority from French Application for Patent No. 1151526 filed Feb. 25, 2011, the disclosure of which is hereby incorporated by reference.

TECHNICAL FIELD

The invention relates to the field of microelectronics and, more particularly, to digital integrated circuits. The invention relates in particular to a specific structure for supply rails that are used to supply the functional cells of an integrated circuit with the power they require in order to operate.

BACKGROUND

Digital integrated circuits perform various logic operations using elementary functional cells. Each one of these cells performs elementary operations and transfers the results of these operations to the adjacent cells to which it is connected. These elementary cells comprise various logic gate structures or structures derived therefrom.

The electric power supplied to the various cells is applied to each of the cells through supply rails that are located at metallization levels that are close to the functional areas of each cell. These rails are generally assembled in pairs and are brought to reference potentials which are generally ground (GND) and a reference voltage that is generally positive but depends on the particular technology used.

It has been observed that reliability problems may affect components because of electromigration phenomena that occur in the conductors that transport currents which have a significant current density.

In fact, electromigration phenomena cause the displacement of atoms inside the metallic conductors due to the impact of electrons. This displacement of atoms can result, in the long-term, in the appearance of areas that are devoid of material within a conductor.

In this case, the useful cross-sectional area of the conductors is therefore reduced and this increases the current density in the remaining cross-section and consequently increases the risks of electromigration. Conduction can, in extreme cases, be limited to the periphery of the conductor in barrier regions with a consequent significant increase in electrical resistance and associated temperature rises.

When electromigration phenomena occur directly above or below connection vias with upper and/or lower metallization levels, conduction can be totally interrupted if the cavity that is created covers the entire interface area between the conductor and the connection via.

SUMMARY

The trend towards increasingly dense component integration is resulting in a reduction in the cross-sectional area of metallic conductors without any real decrease in the overall power consumption of components. In other words, observed current densities are tending to rise and, concomitantly, so are the risks associated with electromigration.

The need to limit the impact of electromigration phenomena and to improve the reliability of digital components has therefore made itself felt.

Thus, according to one aspect, a digital integrated circuit is provided which contains an array of functional cells, whereof a subset is powered by at least one supply rail to which each cell of the subset is connected and wherein the rail comprises a plurality of segments located on two separate metallization levels and at least one conductor element that extends between said two metallization levels and connects two successive segments of said rail.

Thus, the supply rails are divided up into different segments so that the length of the segments at a single metallization level is limited. This limited length makes it possible to reduce the risks associated with electromigration in accordance with the Blech effect which states that, below a predetermined conductor length, electromigration phenomena cannot occur in a line.

Various architectures can be used in relation to different aspects of the invention. Thus, in one embodiment of the invention, the conductor element may extend between the overlapping areas of two successive segments located on two separate metallization levels.

In practice, several conductor elements can connect two successive segments in parallel. In other words, the connection between two metallization levels can be made by several vias or pillars.

According to one aspect, some of the segments extend inside a single cell. Thus, the rail comprises segments located on the first metallization level that are shorter than the others and are confined to a single cell.

BRIEF DESCRIPTION OF THE DRAWINGS

Certain aspects of the invention and its resulting advantages will be readily apparent from the description of the following embodiments, reference being made to the accompanying drawings in which.

Obviously, the dimensions and ratios between the various elements shown in the Figures have been chosen to make the invention easier to understand and may differ from real values.

DETAILED DESCRIPTION OF THE DRAWINGS

Figure 1:
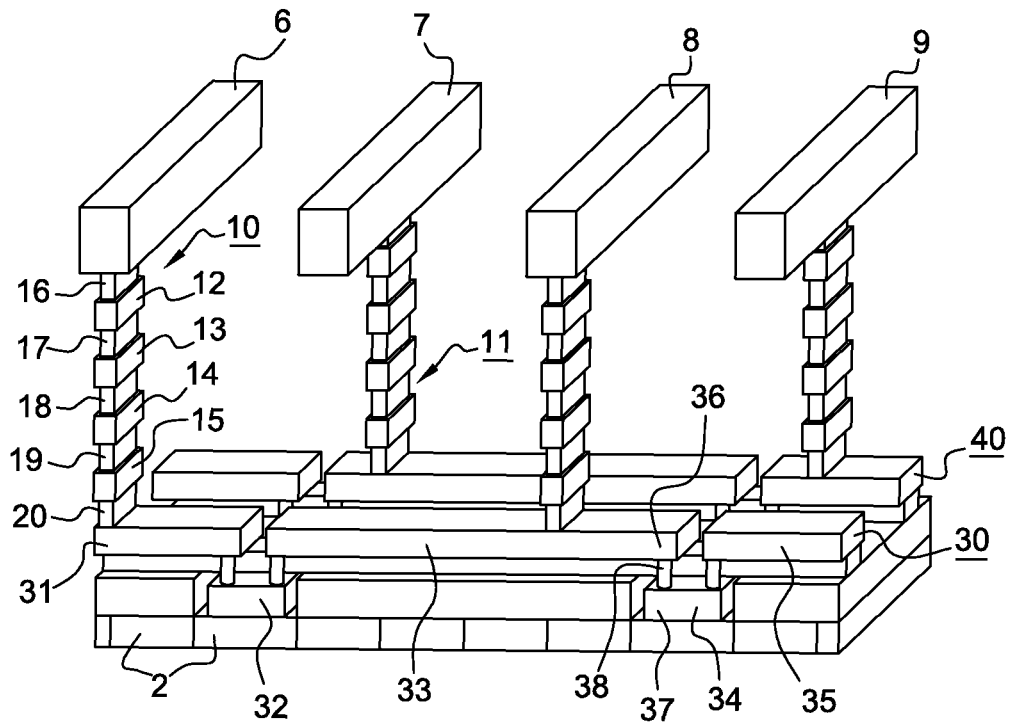
FIG. 1 is a synoptic perspective view of a portion of a supply circuit of a digital integrated circuit in accordance with a first embodiment.

As shown in FIG. 1, a digital integrated circuit comprises a plurality of elementary functional cells 2 produced on a semiconductor substrate which includes metal layers.

These various cells 2 are spatially arranged in the form of an array; only a single row of this array is shown in FIG. 1. These cells 2 are arranged relative to each other in a way that ensures that their inputs and outputs are connected in order to obtain the desired logic functions.

Conventionally, the substrate is covered by a plurality of superposed metallization levels that are separated by insulating layers. Generally speaking, the upper metallization level comprises a number of conductors 6-9 which are connected to reference potentials and designed to carry the power supply current that is needed in order for the various cells 2 to operate.

In the example shown, these conductors 6-9 are of two types, some of them 6, 8 being connected to ground (GND) and others 7, 9 being connected to a positive reference potential ($V_{DD}$). Obviously, it is possible to carry other positive or negative reference potentials depending on the particular application.

As shown in FIG. 1, these main supply conductors 6-9 are connected to the lower metallization levels by conductive columns 10, 11 that are formed by a stack of metals 12-15 deposited on the metallization levels between which there are interposed interconnect vias 16-20 which pass through the insulating layers that separate the metallization levels.

In order to make the invention easier to understand, only the conductive parts are shown in FIG. 1, the insulating parts of the metallization levels and the insulating layers have been omitted.

As shown in FIG. 1, the various cells 2 in a row are powered by two rails 30, 40 which are positioned at right angles to main supply conductors 6-9.

In the embodiment shown, these rails 30, 40 are formed by different segments 31-35 which are located on two separate metallization levels. More precisely, rail 30 comprises segments 32, 34 located on metallization level M1 which rests directly on the active part of functional cells 2, and segments 31, 33, 35 which are located on upper metallization layer M2.

Successive segments 33, 34 have overlapping areas 36, 37 shown in the top view. In these overlapping areas 36, 37 conductor elements 38 are designed to ensure electrical connection between successive segments 33, 34. The useful cross-sectional area of conductor elements 38 is preferably chosen so that it is roughly the same as the useful cross-sectional area of segments 31-35 of the rail. In practice, conductor elements 38 can be made in the same way as interconnect vias 16-20 which electrically connect the different metallization levels.

It is also possible to create several parallel conductor elements and as many vias as are needed to carry the supply current at a current density that is compatible with the particular technological constraints.

Figure 2:
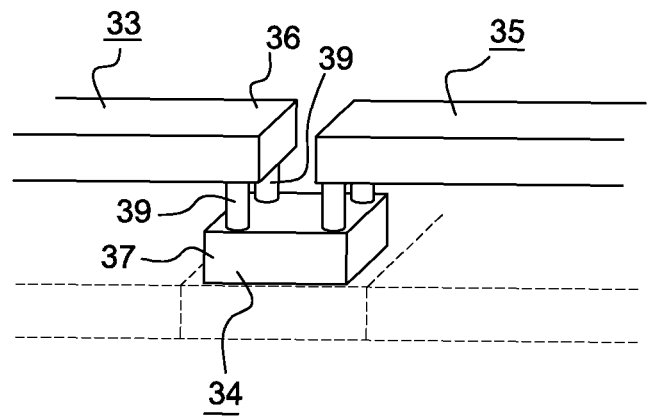
FIG. 2 is a synoptic perspective view of a detail of the interconnect area between two segments of the supply rail.

Thus, as shown in FIG. 2, it is possible to produce one or more vias 39 that connect the lower face of one end 36 of a first segment 33 to the upper face of end 37 of a second segment 34 located on lower metallization level M1. The number and the shape of the vias can obviously be adapted depending on the materials used and the thicknesses of the various layers involved.

Figure 2A:
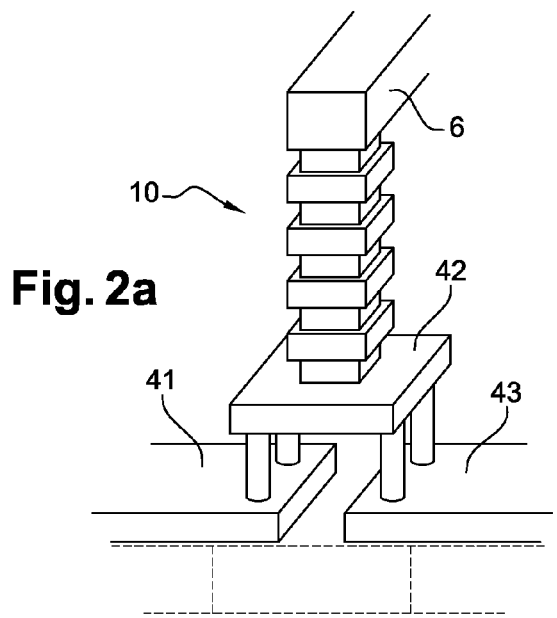
FIG. 2a is a view, similar to FIG. 2, of a variant.

It is also possible, as shown in FIG. 2a, to ensure that shorter segments 42 are located on upper metallization level M2. In this case, the longer segments 41, 43 of the supply rail are located closest to the cells on lower metallization level M1. In one particular embodiment, one can ensure that column 10 which is connected to main supply conductors 6 is located in vertical alignment with shorter segments 42.

Returning to FIG. 1, it is apparent that supply rail 30 is therefore split and longer segments 31, 33, 35 are shown on the upper metallization level which has a given length. This length is limited so that the Blech effect comes into play and the segment in question therefore cannot be the site of electromigration phenomena or such phenomena are at least considerably reduced.

In practice, it has been noticed that, thanks to this splitting up of supply rails 30, 40, it is possible to increase the current density by a factor of several times or more while retaining a limited risk of electromigration phenomena occurring. This way, it is possible to reduce the dimensions (thickness, width) of the conductors that form the rail in order to achieve higher packing densities.

By way of example, for rails that have a useful width of 0.01 µm and are designed to carry a current of 1 mA, equivalent to a current density of 100 mA/µm, the critical length in order for the Blech effect to cancel or very significantly limit the risk of electromigration phenomena occurring is around 6 µm, which is substantially equivalent to the length of two elementary functional cells each having an average length of around 3 µm. Obviously, these values are indicated merely by way of example and may vary depending, in particular, on the technology used, the nature of the materials used and operating conditions, especially temperature.

Various geometries can be used without extending beyond the scope of the spirit of the invention.

Figure 3:
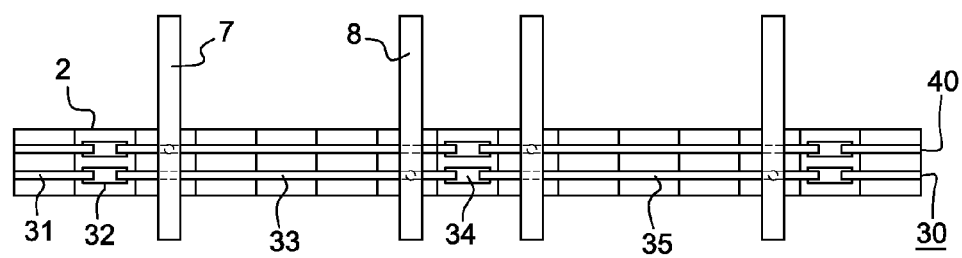
FIG. 3 is a top view showing the configuration of the supply circuit in FIG. 1 on a larger scale.

Thus, as shown in FIG. 3 which corresponds to the configuration in FIG. 1, the various segments 31-35 of rail 30 are produced on two metallization levels, keeping the shortest segments 32, 34 bounded by a single cell 2. In order to facilitate visualization, segments 32, 34 on the lower metallization levels are shown as wider than segments 31, 33, 35 which are located on the upper metallization level but this does not imply that this is a technically mandatory or real feature.

In other words, all the cells, apart from those that comprise a portion of the rail, have sections that are continuous with the supply rail and therefore have a traditional design. The number of cells over which longer segments 31, 33, 35 extend may vary depending on the prospective current density. Thus, this number of cells may vary from several units to one or more dozen units depending on the particular application. In other words, resistance to electromigration phenomena can be improved by using libraries of existing cells in which only a reduced number of cells need to be rerouted due to displacement of the metallization level of the supply rail.

Obviously, in all the variants shown, the shorter segments are shown on lower metallization level M1 which is closest to the functional cells and the longer segments are shown on upper metallization level M2, but this configuration can be reversed without going beyond the scope of the invention.

Figure 4:
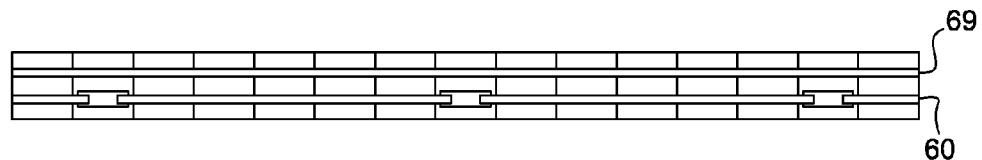
FIGS. 4 and 5 are top views similar to that in FIG. 3 for various different embodiments.

Similarly, in the embodiment shown in FIG. 3, the two rails 30, 40 of the supply circuit are shown as symmetrical relative to the median plane that separates them. Nevertheless, alternative configurations, such as those shown in FIG. 4 in which only one rail 60 of the two rails has a split configuration, can be used. The other rail 69 can be subject to less exacting constraints in terms of current density and can, as appropriate, have a continuous traditional geometry.

Figure 5:
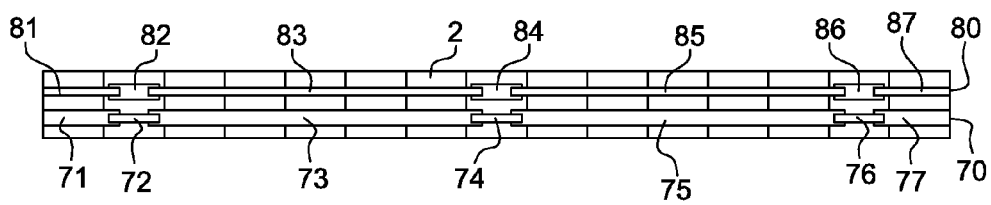

Likewise, one variant shown in FIG. 5 can make provision for two portions of rails 74, 84 being located on two separate metallization levels within a single cell 2. In other words, one metallization level is only occupied by a single supply rail in a given cell.

The above descriptions show that splitting the supply rails, even though it makes the design slightly more complex, has the major advantage of cancelling, or at least considerably limiting, electromigration problems.

What is claimed is:
1. An integrated circuit, comprising:
an array of functional cells including a subset of functional cells powered by at least one supply rail to which each functional cell of the subset is connected, wherein said supply rail comprises:
a first rail segment extending on a first metallization level in a first direction;
a second rail segment extending on a second metallization level also in the first direction and aligned with the first rail segment;

a third rail segment extending on the first metallization level also in the first direction and aligned with the first and second rail segments and further separated on the first metallization level from said first rail segment;

a fourth rail segment extending on the second metallization level also in the first direction and aligned with the first through third rail segments and further separated on the second metallization level from said second rail segment, and conductor elements which extend between said first and second metallization levels and connect two successive ones of said first through fourth segments extending in the first direction, and wherein at least one of the first through fourth segments has a length which does not extend outside a boundary of a single functional cell.

2. The integrated circuit of claim 1, wherein each conductor element extends between overlapping areas of two successive ones of said first through fourth segments located on two separate metallization levels.

3. The integrated circuit of claim 1, wherein the conductor element comprises several posts which connect two successive ones of said first through fourth segments.

4. The integrated circuit of claim 1, wherein the first and third rail segments have a relatively shorter length and a second and fourth rail segments have a relatively longer length.

5. The integrated circuit of claim 4, wherein the first and third rail segments with the relatively shorter length are located in a metallization level above the second and fourth rail segments.

6. The integrated circuit of claim 5, wherein the first and third rail segments include at least one segment electrically connected through a via structure to an upper metallization level containing a power supply line.

7. The integrated circuit of claim 4, wherein the second and fourth segments with the relatively longer length are located in a metallization level above the first and third segments.

8. The integrated circuit of claim 7, wherein the second and fourth segments include at least one segment electrically connected through a via structure to an upper metallization level containing a power supply line.

9. The integrated circuit of claim 1, wherein the first and third segments have a width that is wider than a width of the second and fourth segments.

10. The integrated circuit of claim 1, wherein the first and third segments have a width that is narrower than a width of the second and fourth segments.

11. An integrated circuit, comprising:
functional circuitry;
a power supply line configured to supply power to said functional circuitry, said power supply line formed in a plurality of metallization levels above said functional circuitry;

wherein said power supply line includes:
first and second segments extending in a first metallization level and aligned with each other in a first direction but separated from each other in that first metallization level; and third and fourth segments extending in a second metallization level and aligned with each other in the first direction but separated from each other in that second metallization level;

wherein ends of the first and second segments overlap ends of the third and fourth segments; and vertical conductors interconnecting the overlapping ends of the segments.

12. The integrated circuit of claim 11, further comprising a power supply bus located in an upper one of the metallization levels and an additional vertical conductor interconnecting the power supply bus to at least some of said segments.

13. The integrated circuit of claim 11, wherein the first metallization level is located above said second metallization level.

14. The integrated circuit of claim 11, wherein the first and second segments of the first metallization level have a shorter length than the third and fourth segments of the second metallization level.

15. The integrated circuit of claim 11, wherein the first and second segments of the first metallization level have a longer length than the third and fourth segments of the second metallization level.

16. The integrated circuit of claim 11, wherein the first and second segments of the first metallization level have a wider width than the third and fourth segments of the second metallization level.

17. The integrated circuit of claim 11, wherein the first and second segments of the first metallization level have a narrower width than the third and fourth segments of the second metallization level.

18. The integrated circuit of claim 11, wherein the functional circuitry is digital functional circuitry comprised of a plurality of functional cells aligned in a row adjacent each other extending in the first direction, and wherein the first and second segments pass over the aligned plurality of functional cells for supplying power thereto.

19. The integrated circuit of claim 11, wherein each of the first and second segments has a length which is short enough to cancel or significantly limit a risk of electromigration phenomena in accordance with the Blech effect.

20. The integrated circuit of claim 19, wherein each of the third and fourth segments has a length which is short enough to cancel or significantly limit a risk of electromigration phenomena in accordance with the Blech effect.

* * * * *